United States Patent
Gardner et al.

[19]

[11] Patent Number: 6,124,620

[45] Date of Patent: Sep. 26, 2000

[54] INCORPORATING BARRIER ATOMS INTO A GATE DIELECTRIC USING GAS CLUSTER ION BEAM IMPLANTATION

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/078,797

[22] Filed: May 14, 1998

[51] Int. Cl.[7] .......................... H01L 31/119; H01L 23/58; H01L 27/01
[52] U.S. Cl. .......................... 257/411; 257/649; 257/349
[58] Field of Search .................................. 257/345, 349, 257/411, 649, 410; 438/407

[56] References Cited

U.S. PATENT DOCUMENTS

| | | | |
|---|---|---|---|
| 4,120,700 | 10/1978 | Morimoto | 148/1.5 |
| 4,559,096 | 12/1985 | Friedman et al. | 156/272.2 |
| 4,929,489 | 5/1990 | Dreschhoff et al. | 428/195 |
| 5,070,046 | 12/1991 | Hu | 501/9 |
| 5,111,355 | 5/1992 | Anand et al. | 361/313 |
| 5,142,438 | 8/1992 | Reinberg et al. | 361/313 |
| 5,186,718 | 2/1993 | Tepman et al. | 29/25.01 |
| 5,246,884 | 9/1993 | Jaso et al. | 437/225 |
| 5,281,554 | 1/1994 | Shimada et al. | 437/180 |
| 5,304,503 | 4/1994 | Yoon et al. | 437/43 |
| 5,330,920 | 7/1994 | Soleimani et al. | 437/24 |
| 5,407,870 | 4/1995 | Okada et al. | 435/42 |
| 5,552,337 | 9/1996 | Kwon et al. | 437/60 |
| 5,596,218 | 1/1997 | Soleimani et al. | 257/369 |
| 5,674,788 | 10/1997 | Wristlers et al. | 437/239 |
| 5,677,015 | 10/1997 | Hasegawa | 427/576 |
| 5,834,353 | 11/1998 | Wu | 438/287 |
| 5,920,103 | 7/1999 | Fulford et al. | 257/408 |

OTHER PUBLICATIONS

Huang, et al, "The Influence of Ge–Implantation on the Electrical Characteristics of the Ultra–Shallow Junction Formed by Using Silicide as a Diffusion Source," IEEE Electron Device Letters, vol. 17, No. 3, Mar. 1996, pp. 88–90.

Yamada et al. "Gas Cluster Ion Beam Processing for ULSI Fabrication," Reprinted from Materials Research Society Symposium Proceedings vol. 427, *Advanced Metallization for Future ULSI*.

Raaijamakers "Low Temperature Metal —Organic Chemical Vapor Deposition of Advanced Barrier Layers for the Microelectronics Industry," *Thin Solid Films*, 247 (1994) pp. 85–93.

*Primary Examiner*—Steven H. Loke
*Assistant Examiner*—Douglas W. Owens
*Attorney, Agent, or Firm*—Kevin L. Daffer; Conley, Rose & Tayon

[57] ABSTRACT

An integrated circuit fabrication process is provided for incorporating barrier atoms, preferably N atoms, within a gate dielectric/silicon-based substrate interfacial region using gas cluster ion beam implantation. Gas cluster ion beam implantation involves supercooling a gas to form clusters of atoms from the molecules in the gas. Those clusters of atoms are then ionized and accelerated to a target. Upon striking the target, the clusters of atoms break up into individual atoms. The energy of the ionized cluster is uniformly distributed to the individual atoms. As such, the atoms have a relatively low energy, and thus may be implanted to a shallow depth of less than 100 Å. Barrier atoms positioned within a gate dielectric/substrate interfacial region serve to inhibit the diffusion of metal atoms and impurities from an overlying gate conductor into the substrate. Furthermore, the barrier layer provides protection against hot carrier injection into and entrapment within the gate dielectric.

17 Claims, 9 Drawing Sheets

INCORPORATING BARRIER ATOMS INTO A GATE DIELECTRIC USING GAS CLUSTER ION BEAM IMPLANTATION

BACKGROUND OF THE INVENTION

1. Field of the Invention

This invention relates to integrated circuit fabrication and, more particularly, to a gate dielectric formed between a gate conductor and a channel region of a transistor. An interfacial region of the gate dielectric in close proximity to the channel region is incorporated with nitrogen atoms using gas cluster ion beam implantation to make the interfacial region resistant to penetration by foreign species.

2. Description of the Related Art

Fabrication of metal-oxide-semiconductor ("MOS") transistors is well-known. The manufacturing process begins by lightly doping a single crystalline silicon substrate with n-type or p-type species. Active areas of the substrate in which the transistors and other active devices will reside are then isolated from other active areas with isolation structures. Isolation structures may comprise shallow trenches in the substrate which are filled with a dielectric. Isolation structures may alternatively comprise local oxidation of silicon ("LOCOS") structures. A gate oxide (i.e., silicon dioxide) is then formed upon the substrate by thermally oxidizing the silicon-based substrate. A gate conductor is formed by depositing polycrystalline silicon ("polysilicon") upon the gate dielectric, followed by patterning the polysilicon using typical masking and etching techniques. Subsequently, the polysilicon gate conductor and source/drain regions arranged within the substrate on opposite sides of the gate conductor are concurrently doped with a high dosage of n-type or p-type dopants. If the impurity dopant is n-type, then the resulting transistor is referred to as an NMOS device. Conversely, if the impurity dopant is p-type, then the resulting transistor is referred to as a PMOS device. An integrated circuit which employs both NMOS and PMOS devices is generally known as a complementary MOS or CMOS circuit The resistivity of the polysilicon gate conductor is reduced by the introduction of impurities into the structure. Enough dopants are introduced so that the sheet resistance of the gate conductor is reduced to, in some instances, less than approximately 500 ohms/sq. In an ion implantation process, the depth at which the dopants are implanted can be controlled by adjusting the energy provided to the ions by the ion implantation equipment. However, the minimum depth of implantation is limited to between 200 Å and 400 Å because the energy of each ion is typically too large to permit a lesser depth of implantation.

Subsequent processing steps may require heating of the semiconductor topography. For example, a post-implant anneal is often performed to position and activate the dopants implanted into the source/drain regions and the gate conductor. Dopants with a high diffusivity typically migrate to greater depths within the polysilicon gate than dopants with a low diffusivity. For instance, boron which is commonly used to dope the polysilicon gate and the source/drain regions of an NMOS device undergoes fast diffusion. On the other hand, arsenic which is typically used to dope the polysilicon gate and the source/drain regions of a PMOS device is a slow diffuser. Unfortunately, dopants, like boron, which readily migrate during heat treatment may diffuse from the gate conductor through the gate oxide and into the channel region of the transistor. Boron penetration into the channel can lead to undesirable effects, such as an increase in electron trapping, a decrease in low-field hole mobility, degradation of the transistor drive current, and increased subthreshold current.

Transistor operation may also be detrimentally affected by hot carrier injection ("HCI") into the gate dielectric. HCI is a phenomena by which the kinetic energy of the charge carriers (holes or electrons) is increased as they are accelerated through large potential gradients, causing the carriers to become "hot". The greatest potential gradient, often referred to as the maximum electric field ("Em") occurs near the drain during saturated operation. The hot carriers may become injected into and trapped within the gate dielectric. Traps within the gate dielectric generally become electron traps, even if they are initially filled with holes. As a result of trapped charge accumulating over time in the gate dielectric, an undesirable shift in the threshold voltage of the transistor may occur.

In an attempt to prevent the diffusion of impurities into the channel region and the injection of hot carriers into the gate oxide, barrier atoms are commonly incorporated into the gate oxide/channel interfacial region. For example, nitrogen is commonly introduced into the interfacial region by annealing the semiconductor topography in an ambient comprising $N_2$. Available N atoms may react with Si atoms and O atoms of the gate oxide to form silicon oxynitride ("oxynitride"), terminating any dangling bonds within the gate oxide. The presence of strong N—O bonds of oxynitride throughout the gate oxide would serve to reduce the entrapment of hot carriers within the gate oxide. That is, the hot carriers would have no dangling bonds with which to bond. Further, single N atoms would block the migration pathways into and through the gate oxide, inhibiting fast diffusing impurities from passing from the gate conductor into the channel region. The single N atoms would also form a barrier at the gate oxide/channel interface, inhibiting the injection of hot carriers into the gate oxide.

Unfortunately, only a small fraction (e.g., $\frac{1}{1000}$) of the $N_2$ molecules actually break up into separate N atoms upon entering the gate oxide. As such, only a few N atoms are free to react with dangling bonds within the gate oxide. Further, it is believed that the $N_2$ molecules, unlike individual N atoms, may be too large to fill interstitial positions and vacancies within the gate oxide. Consequently little if any protection against hot carrier injection into, and impurity diffusion through, the gate oxide is accomplished by the $N_2$ diffusion process.

Ion implantation of barrier atoms, e.g., N atoms, into the gate oxide/channel interfacial region has also been employed to prevent species from passing into and out of the gate oxide. The gate oxide may be less than 50 Å thick to ensure high capacitive coupling between the channel and the gate conductor. Ion implantation involves accelerating the ions in an electric field to increase the energy of each ion to greater than 10 keV. Absent the ability to achieve lower energies for the ions, the ions are implanted into a medium to a minimum depth of between 200 and 400 Å. Accordingly, atoms implanted into the gate oxide may migrate well-below the gate oxide/channel interface. The atoms thusly placed fill no interstitial and vacancy positions within the gate oxide. Therefore, the atoms provide no barrier to the migration of impurities from the gate conductor into the channel and to the injection of hot carriers into the gate oxide. The gate oxide, absent of the barrier atoms, still containg dangling bonds, and hence hot carrier traps. Consequently, the implanted barrier atoms do not provide adequate protection against the entrapment of hot carriers escaping into the gate oxide.

It would therefore be of benefit to develop a method for forming a diffusion barrier between the gate conductor and the channel region of a transistor to prevent the migration of dopants into the channel region. It would also be desirable to reduce charge carrier injection into and entrapment within the gate dielectric. Accordingly, dangling bonds within the gate dielectric must be eliminated, and the diffusion barrier must be placed at the gate dielectric/channel interfacial region. Ion implantation of barrier atoms using conventional methods should be avoided to ensure that the diffusion barrier is accurately positioned in the gate dielectric/channel interfacial region. Otherwise, the barrier atoms might be implanted beneath the interfacial region where they would provide little protection against hot carrier injection into the gate dielectric and dopant diffusion into the channel. In addition, barrier atoms provided to the gate dielectric/channel interfacial region must be free to bond with dangling bonds and fill voids within the gate dielectric.

SUMMARY OF THE INVENTION

The problems outlined above are in large part solved by the technique hereof for incorporating barrier atoms within a barrier layer/silicon-based substrate interfacial region using gas cluster ion beam implantation. The barrier layer may form at least a portion of a gate dielectric interposed between a gate conductor and a channel region of a transistor. The barrier layer serves to inhibit the diffusion of metal atoms and impurities from the gate conductor into the channel region. Furthermore, the barrier layer provides protection against hot carrier injection into and entrapment within the gate dielectric.

Gas cluster ion beam implantation involves supercooling a gas by passing it through a super sonic expansion nozzle into a high vacuum chamber. As a result of being supercooled, cluster beams comprising hundreds to thousands of atoms may be generated from molecules in the gas. Those clusters of atoms are then ionized to form cluster ion beams which are passed through an ion accelerator, i.e., an electric field. The ion accelerator causes the ionized clusters of atoms to gain energy as they are directed toward a target. As the ionized clusters of atoms bombard the target, they separate into individual atoms which share the total energy of the corresponding cluster. Since the implanted atoms belong to no molecule, e.g., $N_2$, they are free to bond with other types of atoms. Dividing the total energy of a cluster among individual atoms results in the energy of each atom being much lower than the entire cluster. In fact, the energy of each atom may range from a few eV to hundreds of eV. The relatively low energy of the each atom affords shallow implantation of the atoms into the target material. As such, gas cluster ion beam implantation may be used to accurately implant barrier atoms, e.g., N atoms, to a depth of 5 to 100 Å below a topological surface. Therefore, barrier atoms may be placed within a barrier layer/substrate interfacial region even if the depth of the interfacial region below the topological surface is relatively shallow.

According to an embodiment of the present invention, a gate dielectric is formed upon a silicon-based substrate. The gate dielectric may be composed of, e.g., oxide or silicon nitride ("nitride"). Because of the increased desire to build faster integrated circuits, it has become necessary to increase the switching speed between the on and off states of a transistor. The switching speed of a transistor may be increased by decreasing the gate-to-substrate capacitance. The dielectric constant, K, of $SiO_2$ is a relatively low value of about 4.0. As such, the gate-to-substrate capacitance cannot be reduced below a minimum amount without significantly reducing the thickness of the oxide interposed between the gate conductor and the channel region of the substrate. Unfortunately, thin oxide films may break down when subjected to an electric field. Particularly, for a gate oxide which is less than 30 Å thick, it is highly probable that electrons may pass through the gate oxide by what is known as quantum mechanical tunneling when the gate-to-source voltage is only 3V. In this manner, a tunneling current may inadvertently flow between the semiconductor substrate and the gate conductor, rendering the transistor inoperable. Therefore, in the instance that the gate dielectric of the present embodiment primarily comprises oxide, its thickness may range from 30 to 50 Å. On the other hand, if the gate dielectric primarily comprises nitride which has a K value of about 8.0, the thickness of the gate dielectric may be increased while achieving the same gate-to-substrate capacitance as that of a much thinner (twice as thin) gate oxide. Increasing the thickness of the gate dielectric affords lower breakdown voltage of the gate dielectric.

Barrier atoms, preferably N atoms, may be implanted into the gate dielectric/substrate interfacial region using cluster ion beam implantation to form a barrier layer. That is, ionized clusters of nitrogen atoms are forwarded to the gate dielectric. Upon striking the gate dielectric, the clusters break apart into separate N atoms, each having a relatively low energy. Thus, the low energy N atoms may be implanted to a relatively shallow depth so that they are positioned throughout the gate dielectric/substrate interfacial region. No $N_2$ molecules in which the N atoms are bonded to each other are formed within the interfacial region. The semiconductor topography is then heated to initiate reactions between the N atoms and the pre-existing atoms of the gate dielectric and the substrate. In the instance that the gate dielectric is composed of oxide, it is theorized that the N atoms will react with dangling Si—O bonds to form strong oxynitride (SiON) bonds. On the other hand, if the gate dielectric is composed primarily of nitride, it is believed the N atoms will react with dangling Si—H bonds to form stoichiometric nitride ($Si_3N_4$). Low pressure chemical-vapor deposition ("LPCVD") of nitride from a gas comprising $NH_3$ and $SiH_4$ may have resulted in the formation of such dangling Si—H bonds within the gate dielectric. The N atoms incorporated into the gate dielectric/substrate interfacial region may also fill vacancy and interstitial positions and "stuff" grain boundaries.

A gate conductor, e.g., polysilicon, may be subsequently deposited across the gate dielectric. The gate conductor and gate dielectric may be patterned to define a pair of opposed sidewall surfaces. A lightly doped drain ("LDD") implant may be performed to form LDD areas within the substrate laterally adjacent the gate conductor. Dielectric sidewall spacers are then formed upon the opposed sidewall surfaces of the gate conductor. A heavily doped source/drain ("S/D") implant is performed to form source/drain regions spaced from the gate conductor by the sidewall spacers. The S/D implant may also render the gate conductor conductive by incorporating dopants within the gate conductor. As a result of the S/D implant, a transistor having graded junctions is formed upon and within a silicon-based substrate.

The absence of dangling bonds and weak bonds within the gate dielectric of the transistor substantially inhibits the entrapment of hot carriers within the gate dielectric. Stoichiometric nitride and oxynitride, because of their amorphous properties, advantageously have few grain boundaries, if any, through which foreign species may pass between the gate conductor and the substrate. Further, the migration pathways of foreign species (e.g., hot carriers, metal atoms, or dopants) through the grain boundaries of the gate dielectric/substrate interfacial region are blocked by N atoms. In addition, the gate dielectric/substrate interfacial region has few vacancy and interstitial positions that could be filled by foreign species. As such, passage through the gate dielectric/substrate interfacial region is extremely difficult. Accordingly, implanting N atoms into the gate dielectric/substrate interfacial region reduces the possibility of hot carrier injection into the gate dielectric and metal and dopant diffusion into the substrate.

According to another embodiment, a relatively thin layer of nitride is LPCVD deposited across a silicon-based substrate using a gas comprising $SiH_4$ and $NH_3$. The nitride may subsequently serve as a barrier layer that substantially inhibits the cross-diffusion of species between an ensuing channel region of the substrate and an ensuing overlying gate conductor. Thereafter, a dielectric having a K value greater than about 8.0 is then deposited across the nitride layer. The deposition of the nitride layer and the high K dielectric may be performed consecutively within the same reaction chamber. The reaction chamber is maintained under vacuum between each deposition so that the semiconductor topography is not exposed to ambient oxygen and other contaminants in the interim. Preferably, the dielectric comprises tantalum pentoxide ($Ta_2O_5$) which has a K value of about 25. Together, the nitride layer and the high K dielectric layer serve as the gate dielectric of an ensuing transistor.

Subsequently, barrier atoms, preferably N atoms, may be implanted into the nitride layer and a region of the substrate proximate the substrate surface using cluster ion beam implantation. In this manner, a high concentration of N atoms may be incorporated into the critical nitride layer/substrate interfacial region. The N atoms are annealed to so that they react with Si—H dangling bonds in the nitride layer, thereby improving the stoichiometry of the nitride. The resulting nitride has less dangling bonds that could trap hot carriers and less grain boundaries that could permit migration of foreign species through the nitride layer. The N atoms also fill interstitial and vacancy positions and grain boundaries in the nitride layer/substrate interfacial region. A gate conductor comprising, e.g., polysilicon, titanium nitride (TiN), tungsten (W), iridium (Ir), or indium tin oxide (ITO), is then deposited across the high K dielectric. A transistor is formed from the gate conductor, the nitride layer, and the high K dielectric using well-known techniques. The presence of nitrogen atoms within the nitride layer/substrate interfacial region substantially inhibits metal atoms or dopants from passing from the gate conductor to the channel region of the transistor. The nitrogen atoms are also strategically placed such that hot carrier injection into and entrapment within the gate dielectric are prevented. Using high K dielectric materials for the gate dielectric provides for high gate-to-substrate capacitance without requiring the thickness of the gate dielectric to be decreased. As such, the thickness of the gate dielectric may be sufficient to resist breakdown of the dielectric.

According to an alternate embodiment, a high K dielectric material comprising an oxygen-containing compound, e.g., $Ta_2O_5$, is deposited across a silicon-based substrate. Gas cluster ion beam implantation of N atoms into the high K dielectric/substrate interfacial region is then performed. As such, any silicon dioxide that may have formed at the interface between the substrate and the high K dielectric is incorporated with nitrogen. The N atoms are then heated to cause them to react with dangling Si—O bonds to form SiON. Moreover, the N atoms become positioned within the grain boundaries and interstitial and vacancy positions within the high K dielectric/substrate interfacial region. As a result of the shallow N implant, an oxynitride layer is formed which is heavily doped with N atoms. The presence of the nitrogen-stuffed oxynitride layer between the high K dielectric and the substrate serves as a diffusion barrier against the migration of dopants, e.g., boron, and/or metal from ensuing structures overlying the high K dielectric to the substrate. Further, the oxynitride layer provides protection against hot carrier injection into and entrapment within the gate dielectric stack. Also, incorporating nitrogen into the high K dielectric/substrate interfacial region substantially inhibits oxide from growing between the high K dielectric and the substrate during subsequent anneal steps. If further growth of an oxide between the high K dielectric and the silicon-based substrate were to be permitted, the gate-to-substrate capacitance of the ensuing transistor would be significantly reduced.

A $TiO_2$ layer which has a K value of about 50 may be subsequently deposited across the $Ta_2O_5$. A second gas cluster ion implantation step may be performed to incorporate barrier atoms, e.g., N atoms, into the upper portion of the $TiO_2$. The N atoms lo react with dangling Ti bonds to form TiN. Also, Si atoms that may migrate into the $TiO_2$ can react with O and N atoms to form oxynitride. The presence of the TiN layer serves to inhibit oxidation of the $TiO_2$ during subsequent anneal steps. A gate conductor may subsequently be deposited across the TiN layer and patterned along with the gate dielectric stack. A transistor employing the gate conductor and the gate dielectric stack may then be formed using conventional methods. Preferably, the transistor includes nitride sidewall spacers which extend laterally from the opposed sidewall surfaces of the gate conductor. The nitride sidewall spacers serve as diffusion barriers on opposite sides of the gate conductor to prevent lateral cross-diffusion of dopants and/or metal atoms between the gate conductor and contacts subsequently formed laterally adjacent the sidewall spacers. The $TiO_2$ layer provides for high capacitive coupling between the gate conductor and the substrate and increased thickness in the overall gate dielectric stack. Absent the $TiO_2$ layer, the $T_2O_5$ layer remaining after oxynitride formation may be too thin to avoid breakdown of the gate dielectric stack.

BRIEF DESCRIPTION OF THE DRAWINGS

Other objects and advantages of the invention will become apparent upon reading the following detailed description and upon reference to the accompanying drawings in which.

Figure 1:
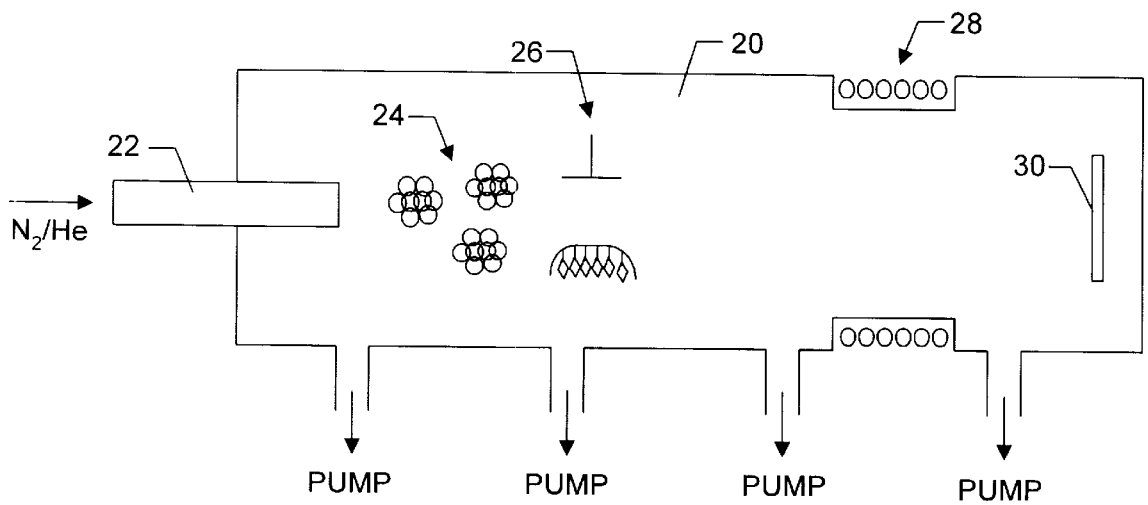
FIG. 1 depicts a side plan view of a cluster ion beam implantation system which may be used to implant atoms to a shallow depth.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a side plan view of a cluster ion beam implantation system which may be used to perform shallow implantation of species into a target. The system includes a super sonic adiabatic expansion nozzle 22. Nozzle 22 passes into an implantation chamber 20 which is maintained at a low pressure of less than about 100 milliTorr (i.e., vacuum regime). Although not shown, nozzle 22 tapers radially such that its inner diameter decreases in a direction toward the inner portion of implantation chamber 20. Several types of pumps, e.g., mechanical booster pumps, diffusion pumps, and turbo-molecular pumps, may be used to evacuate chamber 20. The implantation system also includes an ionizer 26 and an acceleration tube 28. The target 30 into which the ionic clusters are to be implanted is positioned on the opposite end of chamber 20 from nozzle 22 in preparation for the implantation process.

The implantation process involves passing a gas comprising the species to be implanted through nozzle 22 and into chamber 20. An inert gas, such as He may serve as the carrier gas. As shown, $N_2$ may be passed into nozzle 22 to provide for the implantation of N atoms into target 30. As a result of being passed through nozzle 22, the gaseous molecules are supercooled, and thus become clusters of atoms 24, or collimated neutral cluster beams. Those clusters of atoms 24 are then ionized by electron bombardment within implantation chamber 20. Although not shown, a mass filter and a static lens system comprising several electrostatic field plates with small apertures may be positioned within chamber 20 between ionizer 26 and acceleration tube 28. The static lens system and the mass filter may be used to select particular sizes of the ionized clusters for implantation. Those ionized clusters chosen for implantation are electrostatically accelerated toward target 30 as they pass through acceleration tube 28 so that they gain energy. Upon striking target 30, the ionized clusters break up into individual atoms. The total energy of each ionized cluster is uniformly distributed across its corresponding atoms. As such, each atom has a low energy ranging from a few keV to hundreds of keV. The low energy of each atom entering target 30 allows the atoms to be implanted at a shallow depth of 1 to 100 Å below the topological surface of target 30. See, e.g., "Gas Cluster Ion Beam Processing For ULSI Fabrication", Yamada, I. and Matsuo, J., *Material Resources Society Symposium Proceedings*, Volume 427, pp. 265–274 (incorporated herein by reference) for a detailed description of gas cluster ion beam implantation.

Figure 2:
FIG. 2 depicts a partial cross-sectional view of a semiconductor topography according to one embodiment, wherein a gate dielectric is deposited across a silicon-based substrate, subsequent to the step in FIG. 1.
Figure 3:
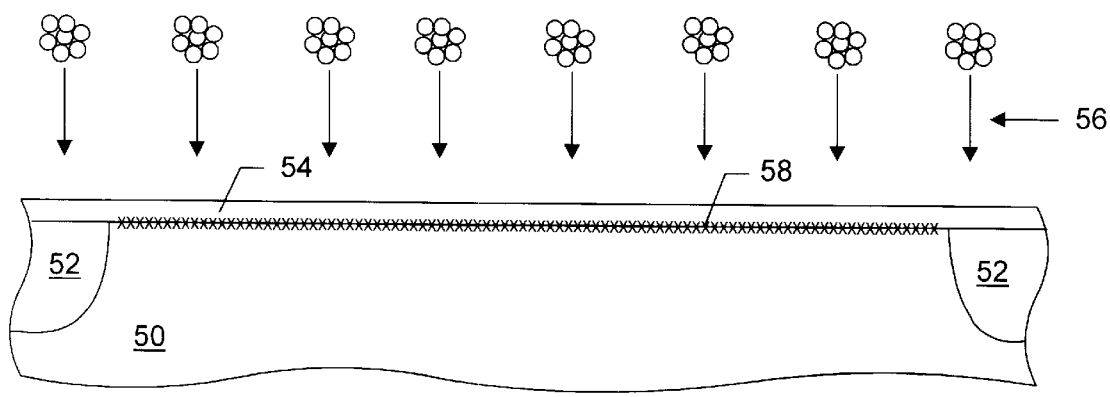
FIG. 3 depicts a partial cross-sectional view of the semiconductor topography, wherein clusters of N atoms are implanted into a gate dielectric/substrate interfacial region, subsequent to the step in FIG. 2.

FIGS. 2–5 depict illustrate the fabrication steps required for one embodiment of the present invention. Turning to FIG. 2, a partial cross-sectional view of a semiconductor substrate 50 is depicted. Substrate 50 comprises single crystalline silicon which has been slightly doped with n-type or p-type impurities. Trench isolation structures 52 are arranged a spaced distance apart within field regions of substrate 50. Trench isolation structures 52 serve to isolate ensuing active of substrate 50. Alternatively, trench isolation structures 52 may be replaced with LOCOS structures. A gate dielectric 54 is CVD deposited across substrate 54. Gate dielectric 54 may be composed of, e.g., oxide or nitride. As shown in FIG. 3, clusters of barrier atoms 56, preferably N atoms, are then implanted into the semiconductor topography to a relatively shallow depth using the ion implantation system depicted in FIG. 1. In this manner, barrier atoms may be placed in the gate dielectric/substrate interfacial region 58.

Figure 4:
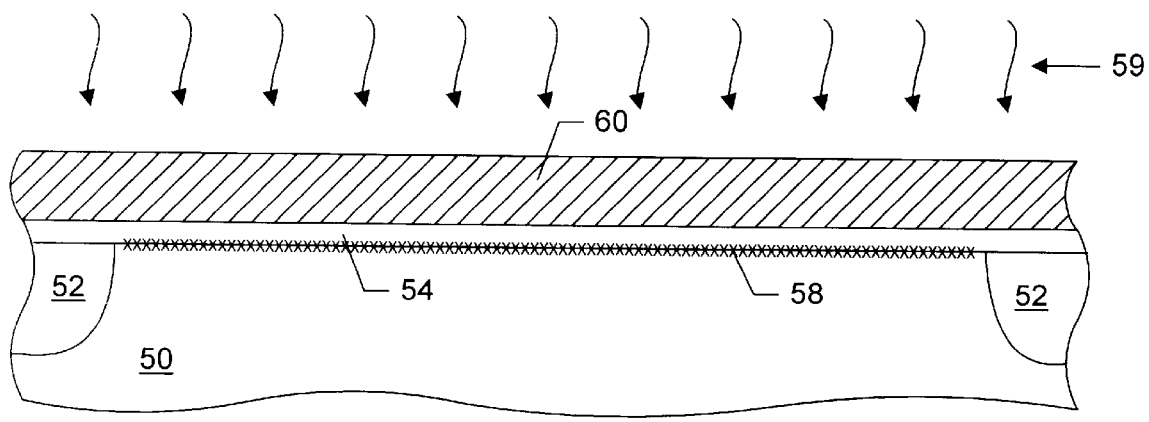
FIG. 4 depicts a partial cross-sectional view of the semiconductor topography, wherein the topography is heated to react the N atoms with other atoms, followed by the deposition of a gate conductor across the gate dielectric, subsequent to the step in FIG. 3.

Subsequently, as shown in FIG. 4, the semiconductor topography is subjected to radiation 59 to heat barrier atoms 58 to a temperature of, e.g., 900 to 1,000° C. Radiation 59 is preferably radiant light supplied from an arc lamp or a tungsten-halogen lamp using a technique known as rapid thermal processing ("RTP"). Using RTP to heat the topography reduces the amount of diffusion of barrier atoms 58. Alternatively, radiation 59 may be thermnal radiation provided from a heated furnace. As a result of the anneal step, N barrier atoms may react with dangling bonds at the gate dielectric 54/substrate 50 interface to form, e.g., oxynitride (SiON) or stoichiometric nitride ($Si_3N_4$). The resulting bonds are strong, and thus are difficult to break. Also, grain boundaries in the gate dielectric/substrate interfacial region 58 become filled with barrier atoms. Further, vacancy and interstitial positions in the gate dielectric/substrate interfacial region 58 become occupied by barrier atoms. Consequently, interfacial region 58 serves as a good diffusion barrier in the ensuing transistor. That is, metal atoms, dopants (e.g., boron), and hot carriers cannot pass through interfacial region 58 between gate dielectric 54 and substrate 50. Also, very few dangling bonds remain within interfacial region 58 to trap hot carriers. FIG. 4 also depicts the deposition of a gate conductor material 60 across gate dielectric 54. Gate conductor material 60 may comprise, e.g., polysilicon, TiN, W, Ir, or ITO.

Figure 5:
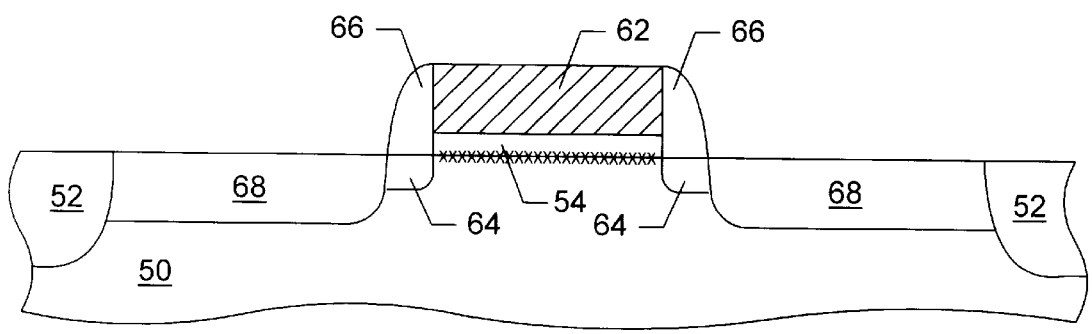
FIG. 5 depicts a partial cross-sectional view of the semiconductor topography, wherein the gate dielectric and the gate conductor are patterned, and a transistor is formed upon and within the substrate, subsequent to the step in FIG. 4.

As shown in FIG. 5, gate conductor material 60 and gate dielectric 54 have been used to form a transistor between trench isolation structures 52. Gate conductor material 60 and gate dielectric 54 have been patterned to define a gate conductor 62 dielectrically spaced above a channel region of substrate 50. Dielectric sidewall spacers 66 extend laterally from the opposed sidewall surfaces of gate conductor 62. Dielectric sidewall spacers 66 may comprise nitride, and thus may provide protection against the lateral migration of species into and out of gate conductor 62. LDD areas 64 are arranged within substrate 50 directly beneath sidewall spacers 66. Also, source and drain regions 68 are spaced laterally from gate conductor 62 by LDD areas 64. LDD areas 64 and source and drain regions 68 effectuate graded junctions which increase in dopant concentration in a lateral direction away from gate conductor 62. The dopant species positioned within LDD areas 64 and source and drain regions 68 are opposite in type to those residing in the channel region of substrate 50. In an alternate embodiment, LDD areas 64 and source and drain regions 68 may reside within a p-type or n-type well formed in substrate 50. Such well regions provide for the formation of a CMOS integrated circuit having both NMOSFET and PMOSFET transistors. During the LDD and S/D implants, dopants become positioned within gate conductor 62. If gate conductor 62 primarily comprises polysilicon, those dopants serve to make gate conductor 62 conductive.

Figure 6:
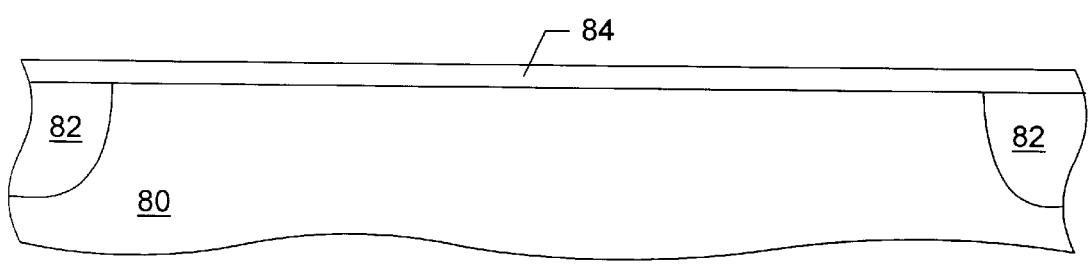
FIG. 6 depicts a partial cross-sectional view of a semiconductor topography according to another embodiment, wherein a nitride barrier layer is formed across a silicon-based substrate.
Figure 7:
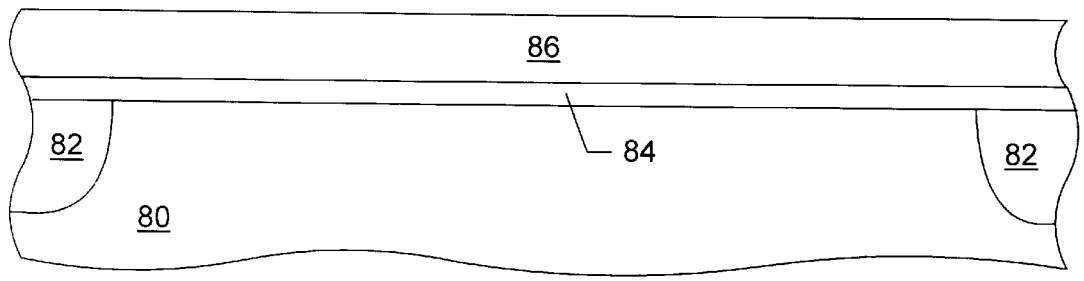
FIG. 7 depicts a partial cross-sectional view of a semiconductor topography, wherein a dielectric having a high K value, e.g., $Ta_2O_5$, is deposited across the nitride barrier layer, subsequent to the step in FIG. 6.

FIGS. 6–14 illustrate a sequence of processing steps according to another embodiment. As shown in FIG. 6, a thin layer of nitride 84 is LPCVD deposited across a lightly doped silicon-based substrate 80 using a gas sourced with, e.g., $NH_3$ and $SiH_4$. Nitride layer 84 may be, e.g., approximately 8 Å thick. Trench isolation structures 82 are arranged a spaced distance apart within field regions of substrate 80. Alternatively, LOCOS structures may be arranged within the field regions of substrate 80. Turning to FIG. 7, a dielectric 86 having a K value greater than that of nitride (K>8.0) is then deposited across the layer of nitride 84. Preferably, dielectric 86 primarily comprises $Ta_2O_5$ which has K value of approximately 22.0. A 40 to 60 Å layer of $Ta_2O_5$ is preferably deposited using metal organic CVD ("MOCVD") from a gas comprising tantalum tetraethoxide dimethylamino ethoxide ("TAT-DMAE"). Alternatively, $Ta_2O_5$ may be deposited across the layer of nitride 84 using a reactive sputtering process. A conventional deposition furnace configured for TEOS deposition may be used to perform the MOCVD of TAT-DMAE. The same reactor used to perform the deposition of the layer of nitride 84 is preferably used for the deposition of dielectric 86. As such, the semiconductor topography may be maintained under vacuum in the interim between the two deposition steps. The topography is thus prevented from being exposed to ambient contaminants during the in-situ processing. The layer of nitride 84 and low K dielectric 86 form a gate dielectric stack upon substrate 80.

Figure 8:
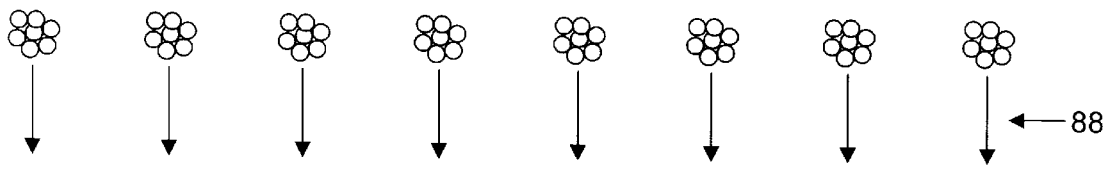
FIG. 8 depicts a partial cross-sectional view of the semiconductor topography, wherein clusters of N atoms are implanted into a nitride layer/substrate interfacial region, subsequent to the step in FIG. 7.
Figure 8:
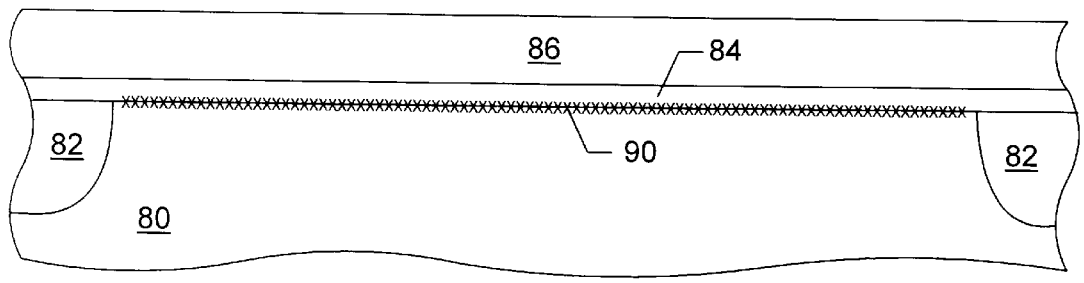
Figure 9:
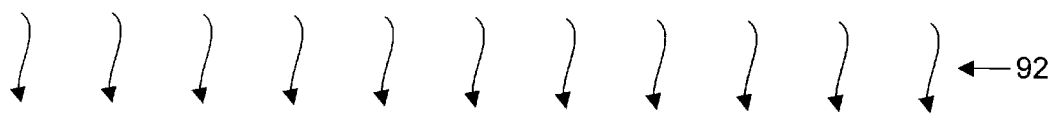
FIG. 9 depicts a partial cross-sectional view of the semiconductor topography, wherein the topography is heated to react the N atoms with other atoms, subsequent to the step in FIG. 8.
Figure 9:
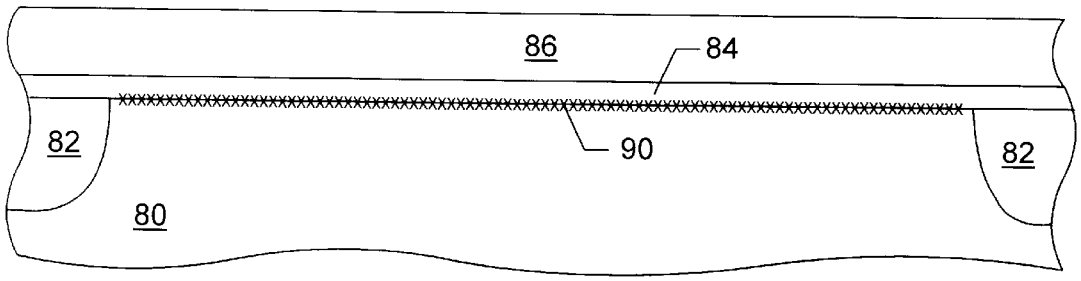
Figure 10:
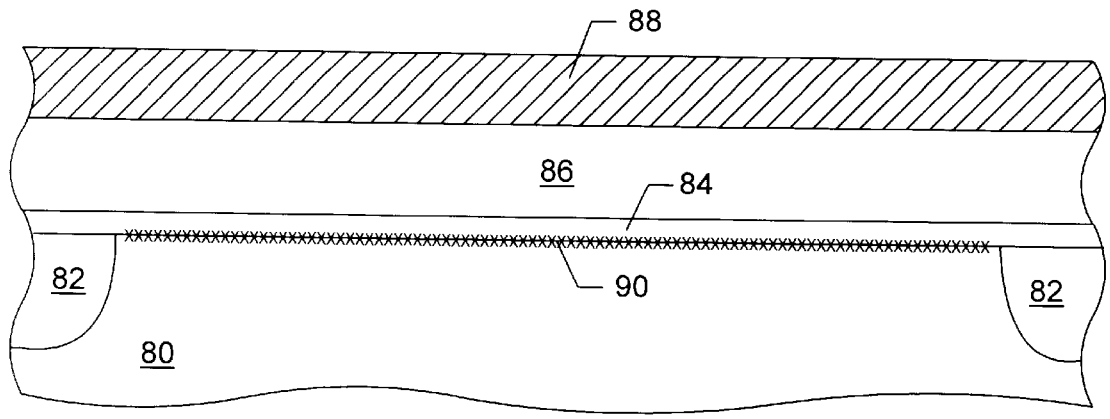
FIG. 10 depicts a partial cross-sectional view of the semiconductor topography, wherein a gate conductor is deposited across the high K dielectric, subsequent to the step in FIG. 9.

FIG. 8 illustrates ionized clusters of barrier atoms 88, e.g., N atoms, being implanted into a nitride/substrate interfacial region 90 using gas cluster ion beam implantation. The depth of implantation below the upper surface of dielectric 86 may be, e.g., 55 to 65 Å. As a result of the implant, a large amount of barrier atoms may be incorporated into interfacial region 90. Subsequently, as shown in FIG. 9, the semiconductor topography may be heated to a temperature of, e.g., 900 to 1,000° C. by exposing it to radiation 92 provided from an RTP chamber or a conventional furnace. As a result of being heating, N atoms may react with dangling Si—H bonds in interfacial region 90, making the layer of nitride 84 more stoichiometric. As shown in FIG. 10, a gate conductor 88 may then be deposited across dielectric 86. Suitable materials for gate conductor 88 include, but are not limited to, polysilicon, TiN, W, Ir, and ITO.

Figure 11:
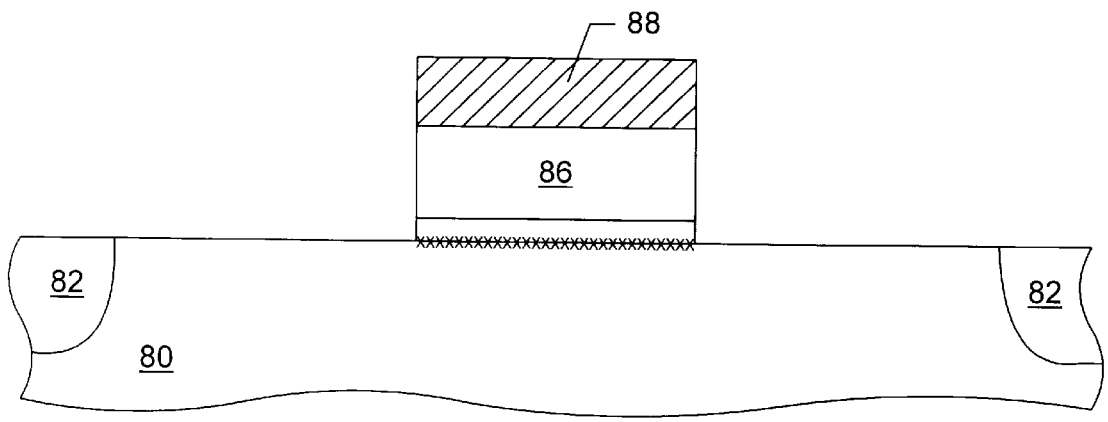
FIG. 11 depicts a partial cross-sectional view of the semiconductor topography, wherein portions of the gate conductor and the gate dielectric stack are removed to define a pair of opposed sidewall surfaces which bound the gate conductor and gate dielectric stack, subsequent to the step in FIG. 10.
Figure 12:
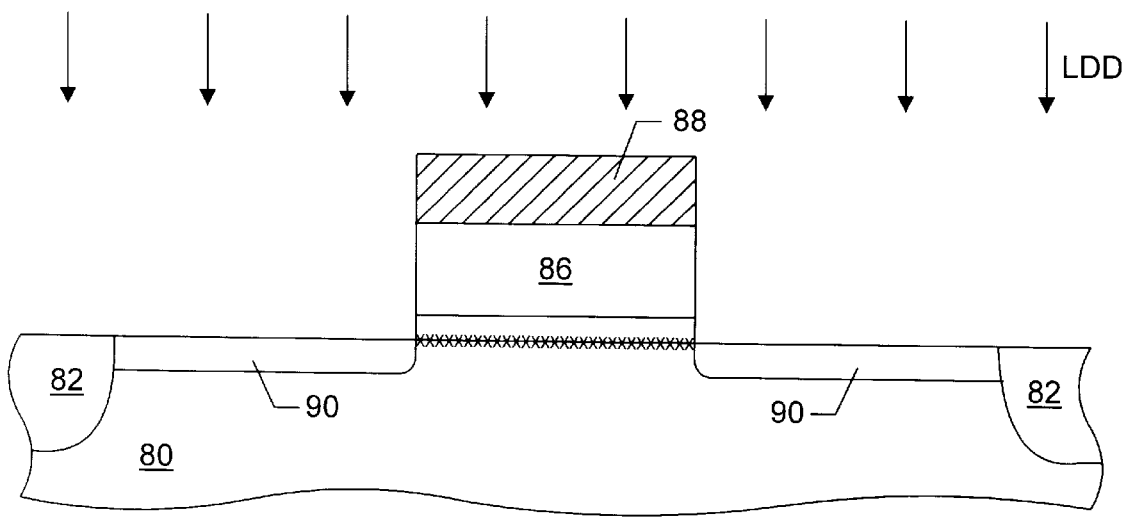
FIG. 12 depicts a partial cross-sectional view of the semiconductor topography, wherein an LDD implant which is self-aligned to the opposed sidewall surfaces is forwarded into the substrate to form LDD areas a spaced distance apart within the substrate, subsequent to the step in FIG. 11.
Figure 13:
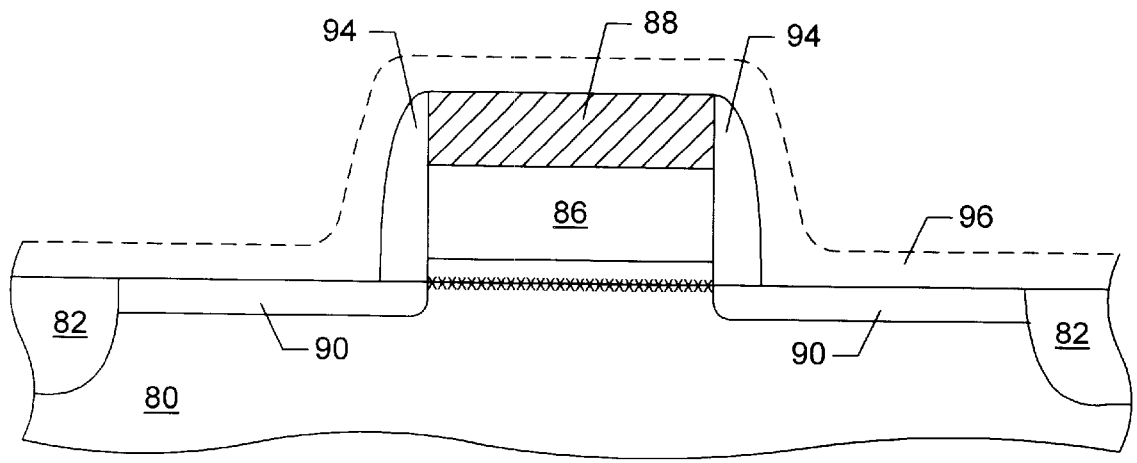
FIG. 13 depicts a partial cross-sectional view of the semiconductor topography, wherein nitride sidewall spacers are formed such that they extend laterally from the opposed sidewall surfaces, overshadowing a portion of the LDD areas, subsequent to the step in FIG. 12.

Turning to FIG. 11, select portions of gate conductor 88, dielectric 86, and nitride 84, are then removed from substrate 80 to define opposed sidewall surfaces which laterally bound gate conductor 88 and the gate dielectric stack. Those select portions may be removed using optical lithography followed by an etch technique, e.g., a dry, plasma etch. The etch duration is selected to terminate before substantial portions of substrate 80 can be etched. Thereafter, an LDD implant may be performed to implant a light concentration of dopants into substrate 80, thereby forming LDD areas 90. Gate conductor 88 and dielectric 86 serve as a masking layer above a channel region of substrate 80 during the LDD implant. As shown in FIG. 13, dielectric sidewall spacers 94 may be formed laterally extending from the opposed sidewall surfaces bounding gate conductor 88 and dielectric 86. Dielectric sidewall spacers 94 are formed by depositing a dielectric layer 96 across the topography and then anisotropically etching the dielectric layer from horizontally oriented surfaces at a faster rate than from vertically oriented surfaces. As such, the dielectric is only retained laterally adjacent the sidewall surfaces of gate conductor 88 and dielectric 86 in the form of sidewall spacers 94. Preferably, sidewall spacers 94 are composed of nitride which forms a good diffusion barrier against lateral migration of dopants or metal atoms residing within gate conductor 88.

Figure 14A:
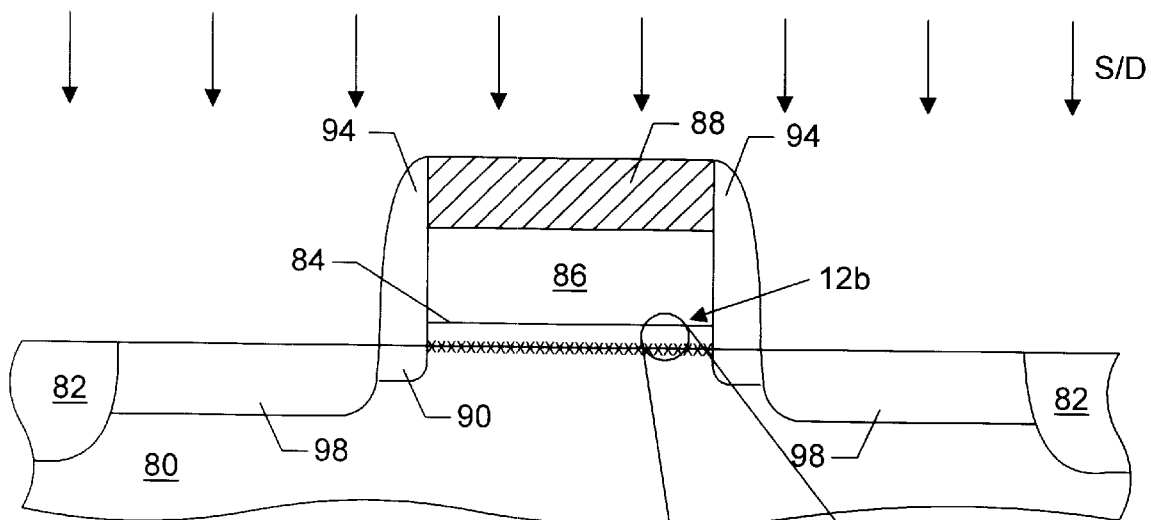
FIG. 14a depicts a partial cross-sectional view of the semiconductor topography, wherein a S/D implant which is self-aligned to the exposed lateral surfaces of the sidewall spacers is forwarded into the substrate to form source/drain regions within the substrate, subsequent to the step in FIG. 13.

As shown in FIG. 14a, a S/D implant may then be performed at a higher dose and energy than the LDD implant. The S/D implant is self-aligned to the exposed lateral surfaces of sidewall spacers 94, and thus results in the formation of source/drain regions 98 a lateral spaced distance from gate conductor 88. Source/drain regions 98 and LDD areas 90 form graded junctions of a transistor having dopants opposite in type to those residing within the channel region of substrate 80. If the transistor being formed is an NMOS transistor, the dopants implanted into the graded junctions may be arsenic or phosphorus. On the other hand, if the transistor being formed is a PMOS transistor, the implanted dopants may be boron or boron difluoride. The presence of high K dielectric 86 between gate conductor 88 and substrate 80 serves to reduce the capacitive coupling between the gate conductor and the substrate. Also, dielectric 86 is sufficiently thick to resistant dielectric breakdown during operation of the resulting transistor.

Figure 14B:
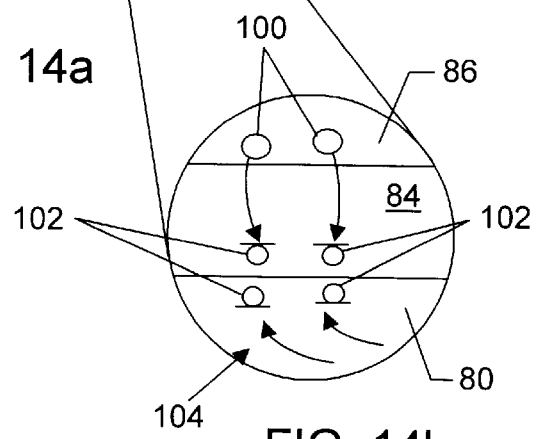
FIG. 14b depicts a detailed view along section 12b of the topography shown in FIG. 14a, wherein N atoms in the nitride layer/substrate interfacial region block the pathways of species from overlying regions into the substrate and of hot carriers from the substrate into the gate dielectric stack.
Figure 15:
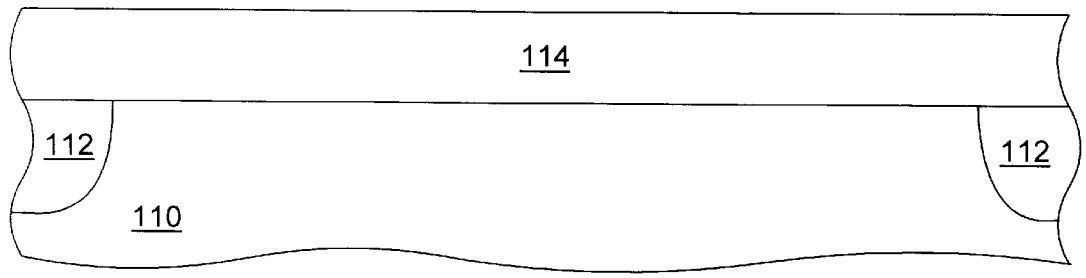
FIG. 15 depicts a partial cross-sectional view of a semiconductor topography according to an alternate embodiment, wherein a high K dielectric comprising an oxygen-containing compound, e.g., $Ta_2O_5$, is deposited across a silicon-based substrate.

FIG. 14b depicts a detailed view along section 12b of FIG. 14a during a subsequent anneal step. For example, a post-implant anneal may be performed to activate and position the as-implanted dopant species. During such an anneal step, species 100, e.g., dopants or metal atoms, within gate conductor 88 may migrate through dielectric 86. However, barrier atoms 102 within the layer of nitride 84 substantially block the diffusion pathways of species 100 so that they cannot pass into substrate 80. Barrier atoms 102 may also block the movement of hot carriers 104 into the layer of nitride 84, preventing hot carrier injection into the gate dielectric stack. Absent of dangling bonds within the interfacial region between substrate 80 and nitride 84, hot carrier entrapment of the hot carriers which escape into nitride 84 is minimal.

Figure 16:
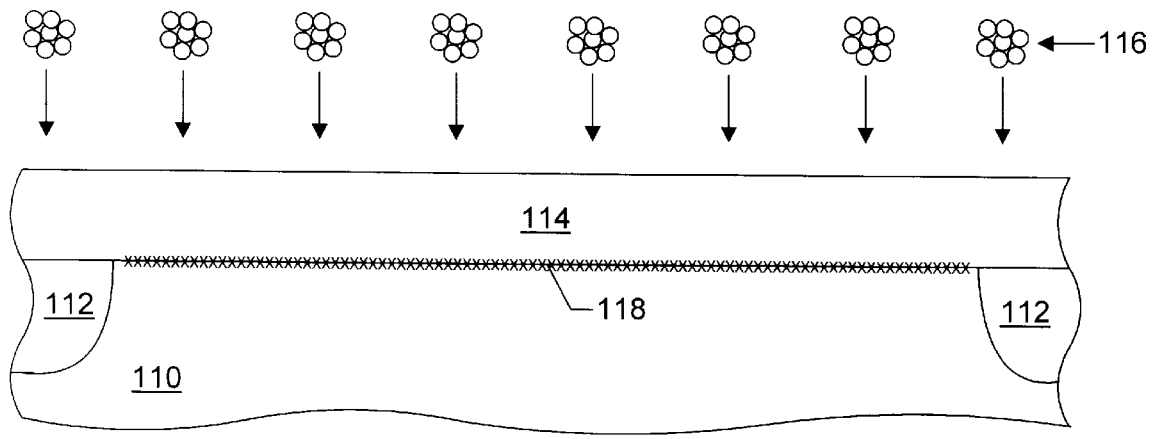
FIG. 16 depicts a partial cross-sectional view of the semiconductor topography, wherein clusters of N atoms are implanted into the high K dielectric/substrate interfacial region, subsequent to the step in FIG. 15.
Figure 17:
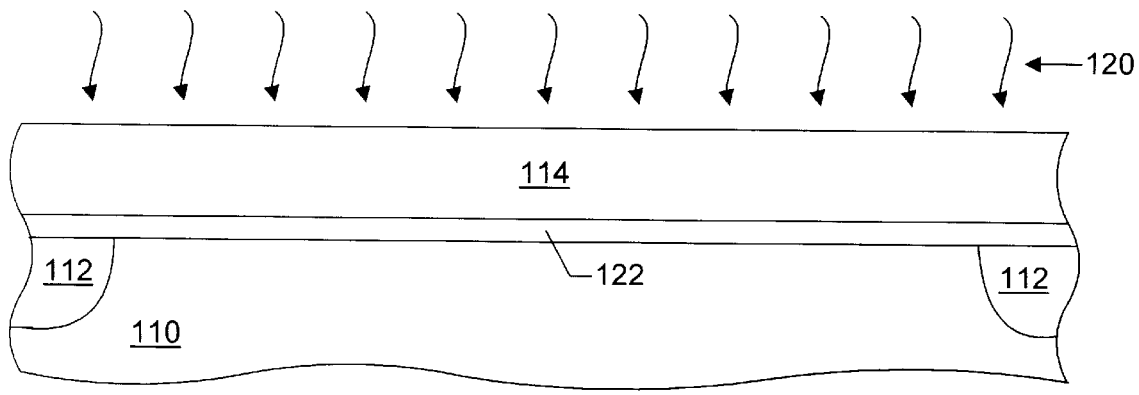
FIG. 17 depicts a partial cross-sectional view of the semiconductor topography, wherein the topography is heated to react the N atoms with Si—O dangling bonds to form an oxynitride layer interposed between the high K dielectric and the substrate, subsequent to the step in FIG. 16.

FIGS. 15–24 illustrate a sequence of semiconductor processing steps for forming a transistor according to one embodiment of the present invention. A slightly doped silicon-based substrate 110 in which trench isolation structures 112 have been formed a spaced distance apart is presented. LOCOS isolation structures may be used instead of trench isolation structures 112 in another embodiment. A dielectric 114 having a K value greater than 8.0 and comprising an oxygen-containing compound is deposited across substrate 110. Preferably, dielectric 114 is $Ta_2O_5$ deposited using MOCVD or physical vapor deposition to a thickness of, e.g., 50 Å. Thereafter, as shown in FIG. 16, ionic clusters of nitrogen atoms 116 are implanted into interfacial region 118 using gas cluster ion beam implantation. The depth of implant may be, e.g., 50 to 53 Å. It is believed that $SiO_2$ may be present in interfacial region 118. Turning to FIG. 17, the topography may then be heated to, e.g., 900 to 1,000° C. to convert the implanted N atoms, the $SiO_2$, and the $Ta_2O_5$ within interfacial region 118 into oxynitride 122. The topography is heated by placing it in an RTP chamber or an annealing furnace and subjecting it to radiation 120. Oxynitride 122 is heavily doped with N atoms, and is thus substantially resistant to penetration by metal atoms, dopants, and hot carriers. The presence of N atoms within oxynitride 122 serves to substantially inhibit oxidation of substrate 110 during subsequent processing steps.

Figure 18:
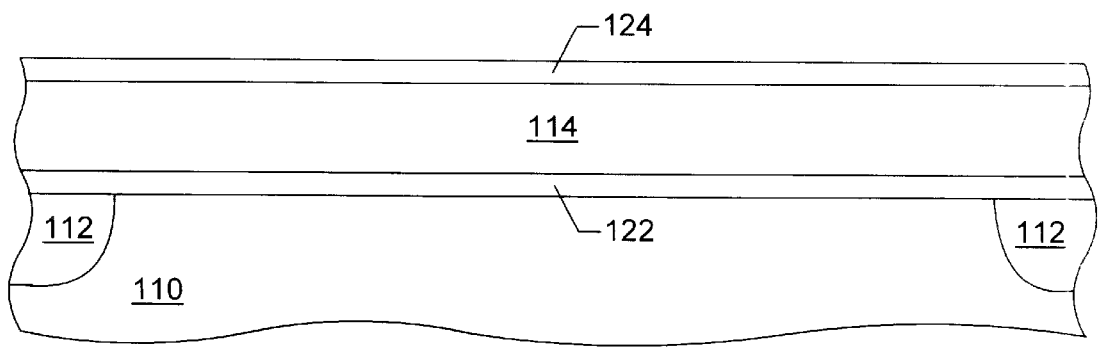
FIG. 18 depicts a partial cross-sectional view of the semiconductor topography, wherein a $TiO_2$ layer is deposited across the topography, subsequent to the step in FIG. 17.
Figure 19:
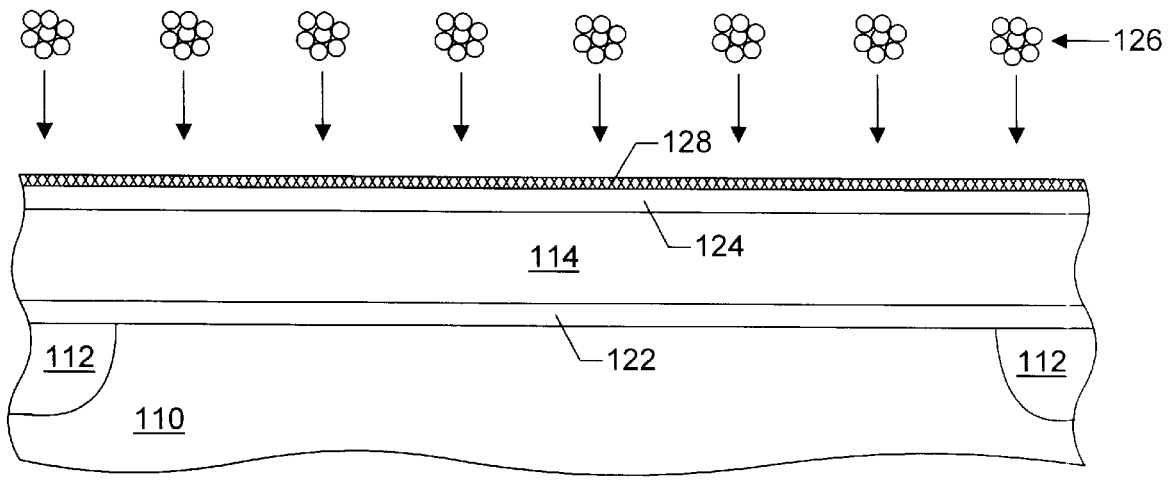
FIG. 19 depicts a partial cross-sectional view of the semiconductor topography, wherein clusters of N atoms are implanted into an upper portion of the $TiO_2$ layer to form TiN therein, subsequent to the step in FIG. 18.

FIG. 18 depicts the deposition of a $TiO_2$ layer 124 across dielectric 114 using, e.g., MOCVD. $TiO_2$ has a relatively high dielectric constant of about 50.0. Clusters of N atoms 126 may then be implanted into an upper portion of $TiO_2$ layer 124 using gas cluster ion beam implantation. Dangling Ti bonds within $TiO_2$ layer 124 may react with the N atoms to form TiN in layer 128 above $TiO_2$ layer 124. Also, the N atoms may react with Si and O proximate the upper surface of $TiO_2$ layer 124 to form oxynitride in layer 124. The N atoms thusly placed serve to inhibit subsequent oxidation of $TiO_2$ layer 124. Oxynitride 122, dielectric 114, and $TiO_2$ layer 124 form a gate dielectric stack above substrate 110. The presence of oxynitride 122 at the upper and lower boundaries of the gate dielectric stack serves to prevent diffusion of species into and out of the gate dielectric stack.

Figure 20:
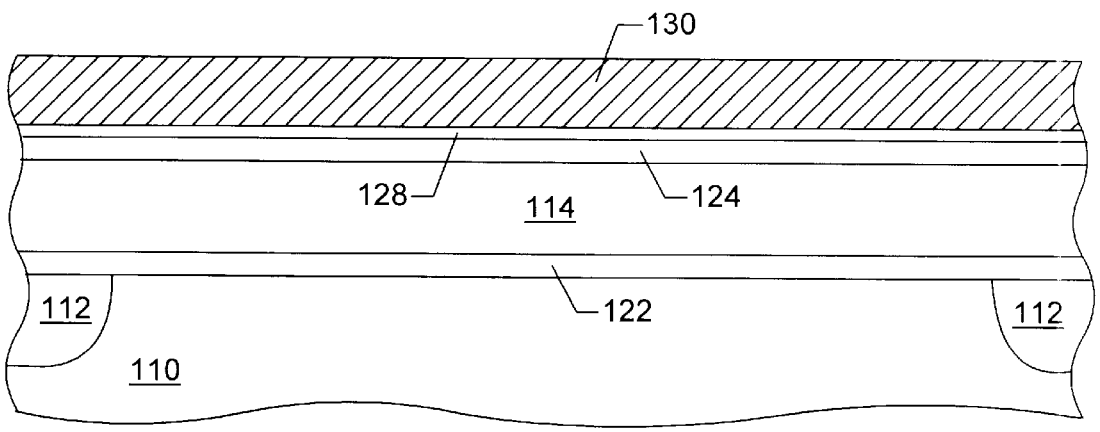
FIG. 20 depicts a partial cross-sectional view of the semiconductor topography, wherein a gate conductor is deposited across the $TiN/TiO_2$ layer, subsequent to the step in FIG. 19.
Figure 21:
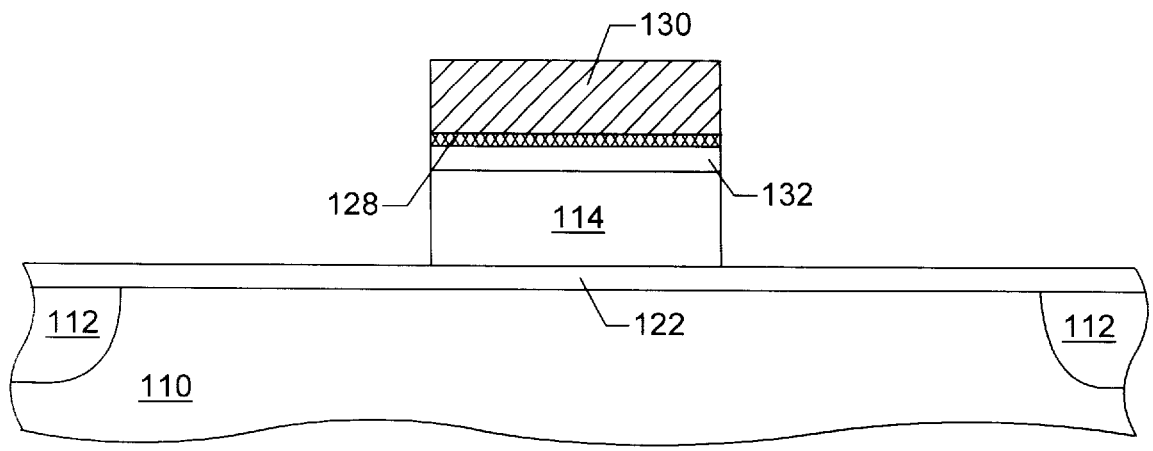
FIG. 21 depicts a partial cross-sectional view of the semiconductor topography, wherein portions of the gate conductor and the gate dielectric stack are removed to define a pair of opposed sidewall surfaces which bound the gate conductor and gate dielectric stack, subsequent to the step in FIG. 20.
Figure 22:
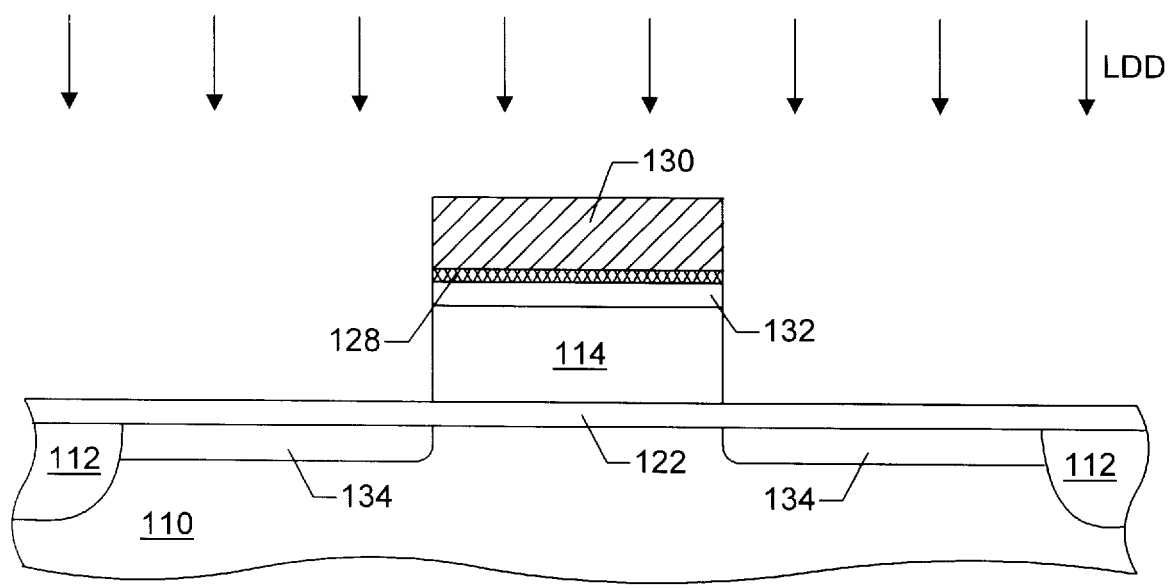
FIG. 22 depicts a partial cross-sectional view of the semiconductor topography, wherein an LDD implant which is self-aligned to the opposed sidewall surfaces is forwarded into the substrate to form LDD areas a spaced distance apart within the substrate, subsequent to the step in FIG. 21.
Figure 23:
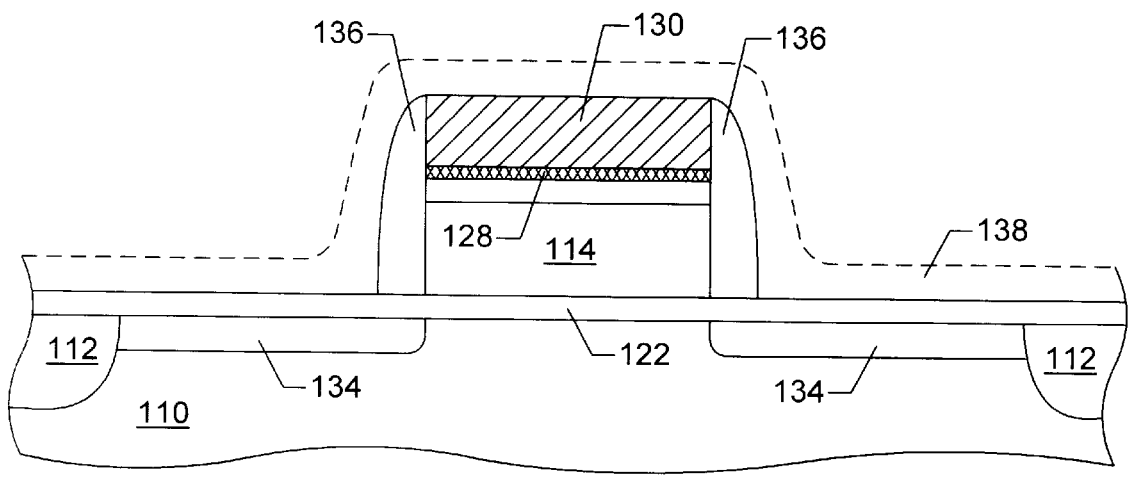
FIG. 23 depicts a partial cross-sectional view of the semiconductor topography, wherein nitride sidewall spacers are formed such that they extend laterally from the opposed sidewall surfaces, overshadowing a portion of the LDD areas, subsequent to the step in FIG. 22.

Turning to FIG. 20, a gate conductor 130 comprising, e.g., polysilicon, TiN, W, Ir, or ITO, is then deposited across the gate dielectric stack. As shown in FIG. 21, gate conductor 130 and select portions of the gate dielectric stack may be removed using lithography and an etch technique, e.g., a plasma etch process. Preferably, the etch duration is terminated before substantial portions of oxynitride 122 are removed. As such, oxynitride 122 may aid in the distribution of dopants subsequently implanted into substrate 110. Alternatively, oxynitride 122 may also be removed from substrate 110 during the etch step. In this manner, a gate conductor 130 and a gate dielectric stack is patterned between a pair of opposed sidewall surfaces. FIG. 22 depicts an LDD implant of dopant species being self-aligned to those opposed sidewall surfaces. As a result of the LDD implant, LDD areas 134 are formed within substrate 110. As shown in FIG. 23, dielectric sidewall spacers 136 may then be formed laterally adjacent those opposed sidewall surfaces by anisotropically etching a dielectric 138 deposited across the topography. Dielectric sidewall spacers 136 preferably comprise nitride.

Figure 24:
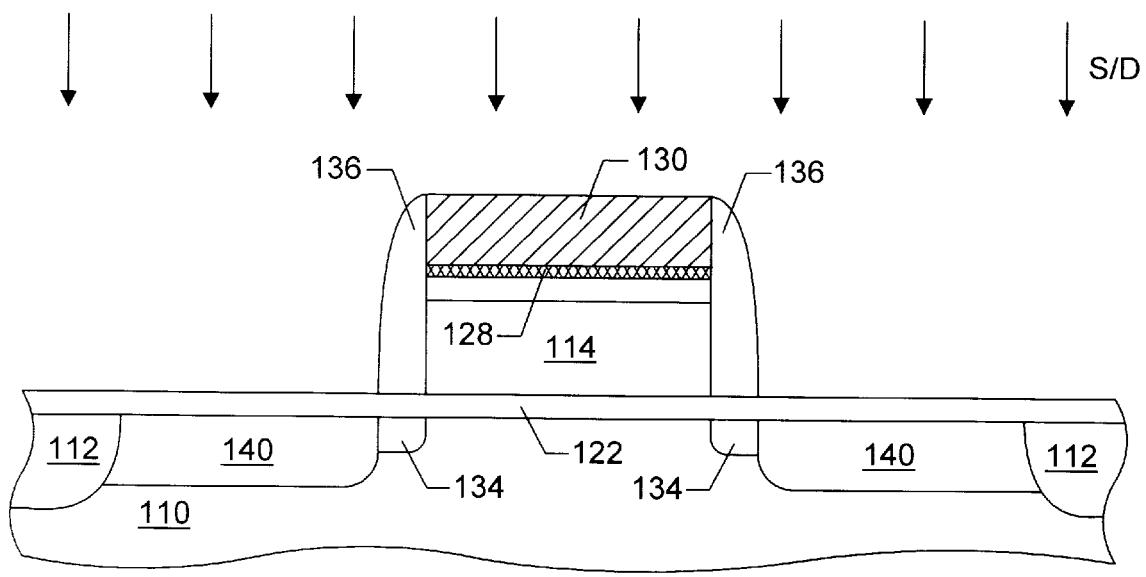
FIG. 24 depicts a partial cross-sectional view of the semiconductor topography, wherein a S/D implant which is self-aligned to the exposed lateral surfaces of the sidewall spacers is forwarded into the substrate to form source/drain regions within the substrate, subsequent to the step in FIG. 23.

FIG. 24 depicts a S/D implant which is self-aligned to the exposed lateral edges of dielectric sidewall spacers 136 being forwarded into substrate 110 to form source/drain regions 110. The high K values of the dielectric stack of the resulting transistor permits high gate-to-substrate capacitance during operation of the transistor. Further, the thickness of the gate dielectric stack is sufficient to prevent a tunneling current from forming between gate conductor 130 and substrate 110. Incorporation of N atoms into the gate dielectric stack affords protection against hot carrier injection into and entrapment within the gate dielectric stack. Also, the presence of the N atoms and N-containing bonds within the gate dielectric stack substantially inhibits the migration of dopants and/or metal atoms from gate conductor 130 to substrate 110. That is, foreign species cannot readily pass through the gate dielectric stack.

It will be appreciated to those skilled in the art having the benefit of this disclosure that this invention is believed to provide a method for incorporating barrier atoms in a gate dielectric/substrate interfacial region using gas cluster ion beam implantation. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising a dielectric layer arranged across a semiconductor substrate and having a thickness of less than about 150 Å, wherein the dielectric layer comprises barrier atoms, and wherein at least most of the barrier atoms within the dielectric layer are unbonded to other barrier atoms within the dielectric layer.

2. The integrated circuit of claim 1, wherein the dielectric layer comprises a dielectric selected from the group consisting of silicon dioxide and silicon nitride.

3. The integrated circuit of claim 1, wherein the barrier atoms comprise nitrogen barrier atoms derived from clusters of nitrogen atoms, and wherein at least most the nitrogen barrier atoms within the dielectric layer are unbonded to other nitrogen barrier atoms within the dielectric layer.

4. The integrated circuit of claim 1, further comprising a gate dielectric having a dielectric constant greater than about 8.0 residing upon the dielectric layer.

5. The integrated circuit of claim 4, wherein the gate dielectric comprises $Ta_2O_5$.

6. The integrated circuit of claim 4, further comprising a gate conductor residing upon the gate dielectric between a pair of opposed sidewall surfaces, wherein the gate conductor comprises a material selected from the group consisting of polysilicon, titanium nitride, tungsten, iridium, and indium tin oxide.

7. The integrated circuit of claim 6, further comprising:
nitride sidewall spacers extending laterally from the pair of opposed sidewall surfaces;
lightly doped drain areas arranged within the semiconductor substrate directly beneath the nitride sidewall spacers; and
source and drain regions arranged within the substrate laterally adjacent the lightly doped drain areas a spaced distance from the gate conductor.

8. An integrated circuit comprising an oxynitride barrier layer interposed between a semiconductor substrate and a gate dielectric comprising an oxygen-containing compound, wherein a combined thickness of the oxynitride barrier layer and the gate dielectric is less than about 150 Å, and wherein the oxynitride barrier layer comprises nitrogen barrier atoms, and wherein the nitrogen barrier atoms within the oxynitride barrier layer are unbonded to other nitrogen barrier atoms within the oxynitride barrier layer.

9. The integrated circuit of claim 8, wherein the gate dielectric comprises a dielectric constant greater than about 8.0.

10. The integrated circuit of claim 9, wherein the gate dielectric comprises $Ti_2O_5$.

11. The integrated circuit of claim 10, further comprising a $TiO_2$ layer residing upon the gate dielectric and a TiN layer residing upon the $TiO_2$ layer.

12. The integrated circuit of claim 11, further comprising a gate conductor residing upon the TiN layer between a pair of opposed sidewall surfaces, wherein the gate conductor comprises a material selected from the group consisting of polysilicon, titanium nitride, tungsten, iridium, and indium tin oxide.

13. The integrated circuit of claim 12, further comprising:
nitride sidewall spacers extending laterally from the pair of opposed sidewall surfaces;
lightly doped drain areas arranged within the semiconductor substrate directly beneath the nitride sidewall spacers; and
source and drain regions arranged within the substrate laterally adjacent the lightly doped drain areas a spaced distance from the gate conductor.

14. The integrated circuit of claim 8, wherein the oxynitride layer consists essentially of silicon, oxygen, and nitrogen.

15. The integrated circuit of claim 14, wherein the nitrogen within the oxynitride layer includes nitrogen barrier atoms that are unbonded to other nitrogen barrier atoms within the oxynitride layer.

16. The integrated circuit of claim 1, wherein all of the barrier atoms within the dielectric layer are unbonded to other barrier atoms within the dielectric layer.

17. The integrated circuit of claim 3, wherein all of the nitrogen barrier atoms within the dielectric layer are unbonded to other nitrogen barrier atoms within the dielectric layer.

\* \* \* \* \*